US012185563B2

(12) United States Patent
Lee et al.

(10) Patent No.: US 12,185,563 B2
(45) Date of Patent: *Dec. 31, 2024

(54) DISPLAY DEVICE

(71) Applicant: SAMSUNG DISPLAY CO., LTD., Yongin-si (KR)

(72) Inventors: Sungsoo Lee, Suwon-si (KR); Heesook Yoon, Yongin-si (KR); Tetsuji Kamine, Asan-si (KR); Muhyun Kim, Seoul (KR); Donghun No, Cheongju-si (KR); Jeongwoo Moon, Suwon-si (KR); Yunjeong Cho, Cheonan-si (KR); Youngkuil Joo, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,691

(22) Filed: May 3, 2023

(65) Prior Publication Data
US 2023/0276654 A1 Aug. 31, 2023

Related U.S. Application Data

(63) Continuation of application No. 17/076,050, filed on Oct. 21, 2020, now Pat. No. 11,665,922, which is a
(Continued)

(30) Foreign Application Priority Data

Jan. 4, 2018 (KR) .................. 10-2018-0001424
Apr. 5, 2018 (KR) .................. 10-2018-0039477

(51) Int. Cl.
*H10K 59/12* (2023.01)
*H01L 23/10* (2006.01)
(Continued)

(52) U.S. Cl.
CPC ......... *H10K 50/8426* (2023.02); *H01L 23/10* (2013.01); *H01L 23/31* (2013.01);
(Continued)

(58) Field of Classification Search
CPC ..... H01L 23/10; H01L 23/31; H01L 23/3142; H01L 27/323; H01L 27/3244;
(Continued)

(56) References Cited

U.S. PATENT DOCUMENTS 6,879,110 B2   4/2005  Koyama
7,940,366 B2   5/2011  Watanabe
(Continued)

FOREIGN PATENT DOCUMENTS

JP    2009070761    4/2009
JP    2011013511    1/2011
(Continued)

OTHER PUBLICATIONS

European Search Report issued in corresponding application No. 19150190.7 on May 24, 2019.

*Primary Examiner* — Eduardo A Rodela
(74) *Attorney, Agent, or Firm* — F. CHAU & ASSOCIATES, LLC

(57) ABSTRACT

A display device including: a substrate element including a base layer, a circuit layer, and a device layer, the base layer forming a plane defined by a first direction and a second direction perpendicular to each other; an encapsulation element provided on the substrate element to seal the device layer; a sealing element provided along edges of the encapsulation element to connect the encapsulation and substrate elements to each other; an optical element provided on the encapsulation element; a window element provided on the substrate element; an adhesive element provided between the optical and window elements to connect the optical
(Continued)

element to the window element; and a filling element provided between the window element and the substrate element, wherein the filling element is spaced apart from the optical element and the adhesive element, and is overlapped with the sealing element when viewed in a direction normal to the plane.

14 Claims, 12 Drawing Sheets

Related U.S. Application Data continuation of application No. 16/239,141, filed on Jan. 3, 2019, now Pat. No. 10,832,982.

(51) Int. Cl.

| | | |
|---|---|---|
| *H01L 23/31* | (2006.01) | |
| *H10K 50/84* | (2023.01) | |
| *H10K 50/842* | (2023.01) | |
| *H10K 50/86* | (2023.01) | |
| *H10K 59/40* | (2023.01) | |
| *G06F 3/044* | (2006.01) | |
| *H10K 59/38* | (2023.01) | |

(52) U.S. Cl.
CPC ......... *H01L 23/3142* (2013.01); *H10K 50/84* (2023.02); *H10K 50/841* (2023.02); *H10K 50/8428* (2023.02); *H10K 50/86* (2023.02); *H10K 59/12* (2023.02); *H10K 59/40* (2023.02); *G06F 3/044* (2013.01); *H10K 50/865* (2023.02); *H10K 59/38* (2023.02)

(58) Field of Classification Search
CPC ............... H01L 51/5237; H01L 51/524; H01L 51/5246; H01L 51/525; H01L 51/5281; H01L 27/322; H01L 51/5284; H01L 51/5262; H01L 27/32; H01L 27/3248; H01L 27/3258; H01L 23/02; H01L 23/04; G06F 3/044

See application file for complete search history.

(56) References Cited

U.S. PATENT DOCUMENTS

| | | | | |
|---|---|---|---|---|
| 8,492,969 | B2 * | 7/2013 | Lee | ............... H05B 33/04 313/504 |
| 8,789,984 | B2 | 7/2014 | Lee et al. | |
| 8,988,625 | B2 | 3/2015 | Yamazaki et al. | |
| 9,147,859 | B2 * | 9/2015 | Kim | ............... H10K 50/841 |
| 9,362,520 | B2 * | 6/2016 | Sato | ............... H10K 59/35 |
| 9,466,646 | B2 | 10/2016 | Kim et al. | |
| 9,871,221 | B2 | 1/2018 | Senoo et al. | |
| 10,159,147 | B2 | 12/2018 | Kim | |
| 10,243,025 | B2 | 3/2019 | Chang | |
| 10,832,982 | B2 | 11/2020 | Lee et al. | |
| 11,665,922 | B2 * | 5/2023 | Lee | ............... H10K 59/12 257/40 |
| 2006/0066234 | A1 | 3/2006 | Lu et al. | |
| 2010/0208188 | A1 | 8/2010 | Tsai et al. | |
| 2011/0089819 | A1 | 4/2011 | Mo et al. | |
| 2012/0120364 | A1 | 5/2012 | Wu et al. | |
| 2012/0154707 | A1 | 6/2012 | Hsieh et al. | |
| 2014/0042408 | A1 | 2/2014 | Akagawa et al. | |
| 2014/0291649 | A1 | 10/2014 | Takahashi et al. | |
| 2015/0028307 | A1 * | 1/2015 | Kim | ............... H10K 50/844 257/40 |
| 2015/0123092 | A1 | 5/2015 | Kikuchi et al. | |
| 2015/0185527 | A1 | 7/2015 | Chang | |
| 2015/0236293 | A1 | 8/2015 | Lee et al. | |
| 2016/0066461 | A1 | 3/2016 | Park et al. | |
| 2017/0213976 | A1 | 7/2017 | Luo et al. | |
| 2017/0237033 | A1 | 8/2017 | Koshihara et al. | |
| 2017/0331072 | A1 | 11/2017 | Jo et al. | |
| 2019/0131567 | A1 | 5/2019 | Li | |
| 2019/0207145 | A1 | 7/2019 | Lee et al. | |
| 2019/0280078 | A1 | 9/2019 | Takahashi et al. | |
| 2019/0296265 | A1 | 9/2019 | Um et al. | |
| 2019/0334119 | A1 | 10/2019 | Sato et al. | |
| 2021/0043526 | A1 | 2/2021 | Lee et al. | |

FOREIGN PATENT DOCUMENTS

| | | |
|---|---|---|
| JP | 2012093738 | 5/2012 |
| JP | 2014035799 | 2/2014 |
| JP | 2016081031 | 5/2016 |
| JP | 2017068283 | 4/2017 |
| KR | 10-0953654 | 4/2010 |
| KR | 10-2013-0103013 | 9/2013 |
| KR | 10-2015-0025388 | 3/2015 |
| KR | 10-2015-0044720 | 4/2015 |
| KR | 10-1521114 | 5/2015 |
| KR | 10-2015-0076869 | 7/2015 |
| KR | 10-2015-0137223 | 12/2015 |
| KR | 10-2016-0028581 | 3/2016 |
| KR | 10-2017-0026508 | 3/2017 |
| KR | 10-1759577 | 7/2017 |
| KR | 10-2019-0020881 | 3/2019 |
| TW | 201327838 | 7/2013 |
| WO | 2007066424 | 6/2007 |

\* cited by examiner

DISPLAY DEVICE

CROSS-REFERENCE TO RELATED APPLICATIONS

This U.S. non-provisional patent application is a continuation of U.S. patent application Ser. No. 17/076,050 filed on Oct. 21, 2020, which is a continuation of U.S. patent application Ser. No. 16/239,141 filed on Jan. 3, 2019, now U.S. Pat. No. 10,832,982 issued on Nov. 10, 2020 which claims priority under 35 U.S.C. § 119 to Korean Patent Application Nos. 10-2018-0001424 and 10-2018-0039477, filed on Jan. 4, 2018 and Apr. 5, 2018, respectively, the disclosures of which are incorporated by reference herein in their entireties.

TECHNICAL FIELD

The present inventive concept relates to a display device, and in particular, to a display device with high reliability.

DISCUSSION OF RELATED ART

Various display devices are being developed. For example, various display devices are being developed for use in multimedia devices such as televisions, mobile phones, navigation systems, computer monitors, gaming machines, and the like. Various components are assembled to fabricate a display device. The display device is generally designed so that it can function reliably.

SUMMARY

According to an exemplary embodiment of the inventive concept, a display device may include a substrate element including a base layer, a circuit layer provided on the base layer, and a device layer electrically connected to the circuit layer, wherein the device layer is configured to generate light, and the base layer forms a plane defined by a first direction and a second direction perpendicular to each other. The display device further includes an encapsulation element provided on the substrate element to seal the device layer, a sealing element provided along edge regions of the encapsulation element to connect the encapsulation and substrate elements to each other, an optical element provided on the encapsulation element, a window element provided on the substrate element, an adhesive element provided between the optical element and the window element to connect the optical element to the window element, and a filling element provided between the window and substrate elements, wherein the filling element is spaced apart from the optical and adhesive elements, and is overlapped with the sealing element when viewed in a direction normal to the plane.

In an exemplary embodiment of the inventive concept, the sealing element may include an inner side surface defining a hermetically-sealed internal space, along with the substrate element and the encapsulation element, and an outer side surface facing the inner side surface, and a portion of the outer side surface may be in contact with the filling element.

In an exemplary embodiment of the inventive concept, a bottom surface of the filling element may be in contact with a portion of a top surface of the encapsulation element, a side surface of the encapsulation element adjacent to the filling element, a portion of a bottom surface of the encapsulation element adjacent to the side surface of the encapsulation element, the outer side surface of the sealing element, and a portion of a top surface of the substrate element.

In an exemplary embodiment of the inventive concept, when measured in the second direction, a width of the filling element may be larger than a width of the sealing element, and the filling element may cover the sealing element, when viewed in the direction normal to the plane.

In an exemplary embodiment of the inventive concept, the display device may further include a driver chip mounted on the substrate element. The substrate element may include a first region, which is not covered by the encapsulation element, and a second region, which is adjacent to the first region and is covered with the encapsulation element. The driver chip may be provided on the first region, and at least a portion of the filling element may be overlapped with the driver chip in the second direction.

In an exemplary embodiment of the inventive concept, the filling element may include a first filling element, which is overlapped with the driver chip when viewed in the direction normal to the plane, and a second filling element, which is spaced apart from the first filling element and is not overlapped with the driver chip.

In an exemplary embodiment of the inventive concept, when measured in the second direction, a width of the first filling element may be less than a width of the second filling element.

In an exemplary embodiment of the inventive concept, a plurality of the first filling elements may be provided, and when measured in the first direction, a distance between each of the first filling elements may be larger than a distance between the second filling element and one of the first filling elements adjacent to the second filling element.

In an exemplary embodiment of the inventive concept, the filling element may include a first filling element, which is overlapped with the driver chip, and a second filling element, which is spaced apart from the first filling element and is not overlapped with the driver chip. The first filling element may be spaced apart from the driver chip, when viewed in the direction normal to the plane.

In an exemplary embodiment of the inventive concept, the display device may further include a touch unit provided between the encapsulation element and the optical element, and a touch flexible circuit board electrically connected to the touch unit.

In an exemplary embodiment of the inventive concept, a plurality of the filling elements may be provided. The filling elements may include a first filling element and a second filling element, which are arranged in the first direction with the touch flexible circuit board interposed therebetween when viewed in the direction normal to the plane, and the first filling element and the second filling element may be spaced apart from the touch flexible circuit board.

In an exemplary embodiment of the inventive concept, the sealing element may include a frit.

In an exemplary embodiment of the inventive concept, the circuit layer may include a thin-film transistor including a semiconductor pattern, a control electrode spaced apart from the semiconductor pattern, and input and output electrodes which are respectively coupled to two portions of the semiconductor pattern. The device layer may include an organic light emitting diode including a first electrode coupled to the thin-film transistor, a second electrode provided on the first electrode, and a luminescent layer provided between the first and second electrodes.

According to an exemplary embodiment of the inventive concept, a display device may include a substrate element including a base layer, a circuit layer provided on the base layer, and a device layer electrically connected to the circuit layer, wherein the device layer is configured to generate light, the base layer forms a plane defined by a first direction and a second direction perpendicular to each other, and the substrate element includes a first region and a second region adjacent to the first region in the second direction. The display device further includes an encapsulation element provided to cover the second region and to expose the first region, the encapsulation element including a third region and a fourth region adjacent to the third region in the second direction, a sealing element provided along edge regions of the encapsulation element to connect the encapsulation element to the substrate element, an optical element provided to cover the fourth region and to expose the third region, a window element provided on the substrate element, an adhesive element provided between the optical element and the window element to connect the optical element to the window element, and a plurality of filling elements provided between the window element and the base layer. The filling elements may be spaced apart from the optical element and the adhesive element and may be overlapped with a portion of each of the first region and the third region.

In an exemplary embodiment of the inventive concept, the sealing element may include an inner side surface defining a hermetically-sealed internal space, along with the substrate element and the encapsulation element, and an outer side surface facing the inner side surface, and the outer side surface may be in contact with at least one of the filling elements.

In an exemplary embodiment of the inventive concept, a bottom surface of at least one of the filling elements may be in contact with a portion of a top surface of the encapsulation element, a side surface of the encapsulation element adjacent to the filling element, a portion of a bottom surface of the encapsulation element adjacent to the side surface of the encapsulation element, the outer side surface of the sealing element, and a portion of a top surface of the substrate element.

In an exemplary embodiment of the inventive concept, the display device may further include a driver chip that is provided on the first region and is overlapped with at least one of the filling elements, when viewed in a direction normal to the plane. When measured in the second direction, a width of one of the filling elements overlapped with the driver chip may be less than a width of another of the filling elements that is spaced apart from the driver chip.

In an exemplary embodiment of the inventive concept, the display device may further include a touch unit provided between the encapsulation element and the optical element and a touch flexible circuit board electrically connected to the touch unit. The filling elements may include a first filling element and a second filling element, which are arranged in the first direction with the touch flexible circuit board interposed therebetween when viewed in a direction normal to the plane, and the first filling element and the second filling element may be spaced apart from the touch flexible circuit board.

According to an exemplary embodiment of the inventive concept, a display device may include a substrate element including an organic light emitting diode for generating light, an encapsulation element provided on the substrate element to seal the organic light emitting diode, a sealing element provided along edge regions of the encapsulation element, the sealing element connecting the encapsulation element to the substrate element and including an outer side surface adjacent to the organic light emitting diode and an inner side surface facing the outer side surface, a window element provided on the substrate element, an adhesive element provided on the encapsulation element, and a filling element provided between the window element and the substrate element and spaced apart from the adhesive element to cover the sealing element.

In an exemplary embodiment of the inventive concept, the filling element may be in direct contact with the outer side surface of the sealing element.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF THE EMBODIMENTS

Figure 1:
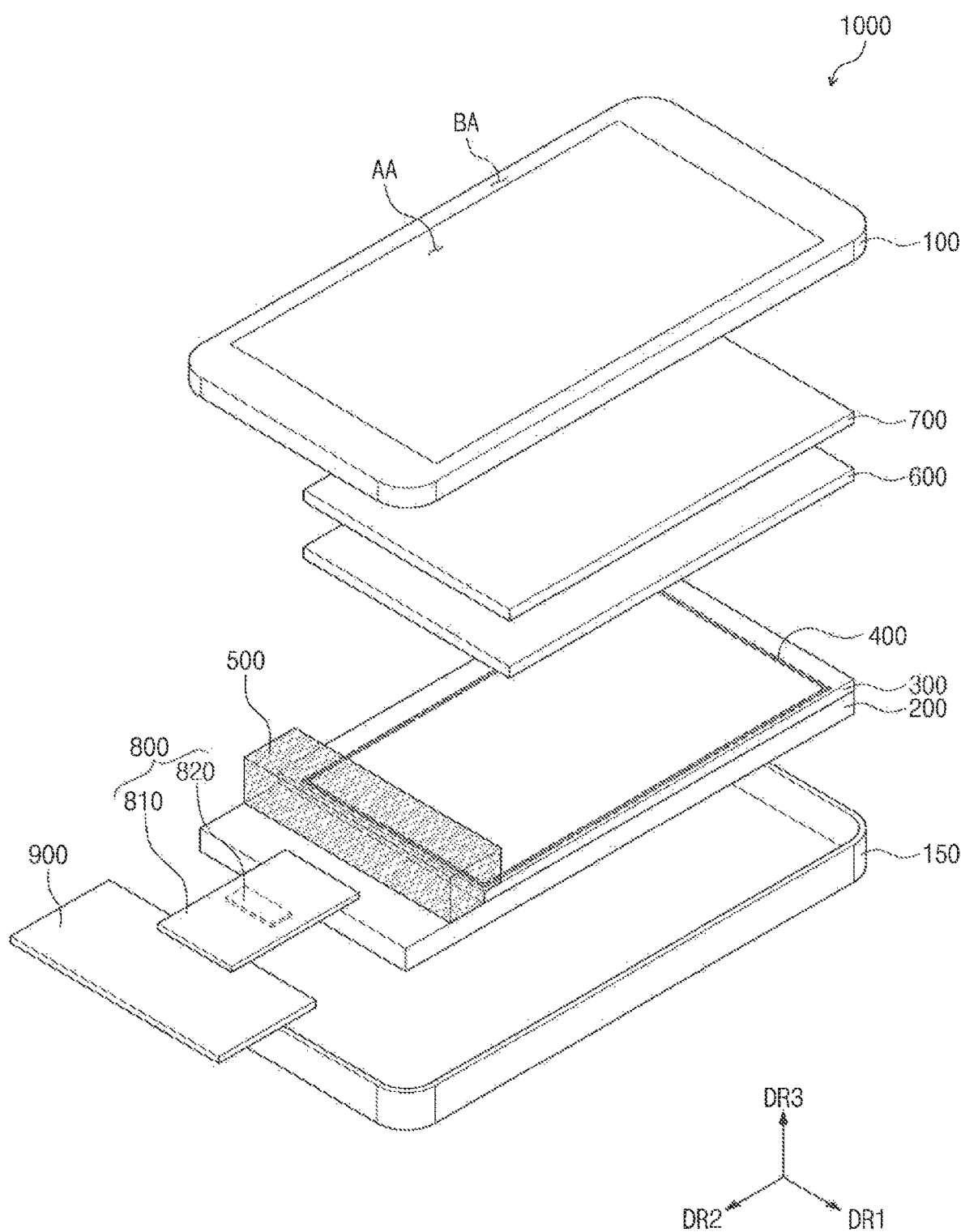
FIG. 1 is an exploded perspective view of a display device according to an exemplary embodiment of the inventive concept.

Exemplary embodiments of the inventive concept will now be described more fully with reference to the accompanying drawings. Exemplary embodiments of the inventive concept may, however, be embodied in many different forms and should not be construed as being limited to the embodiments set forth herein. In the drawings, the thicknesses of layers and regions may be exaggerated for clarity. Like reference numerals in the drawings may denote like elements, and thus, their description may be omitted.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Figure 2:
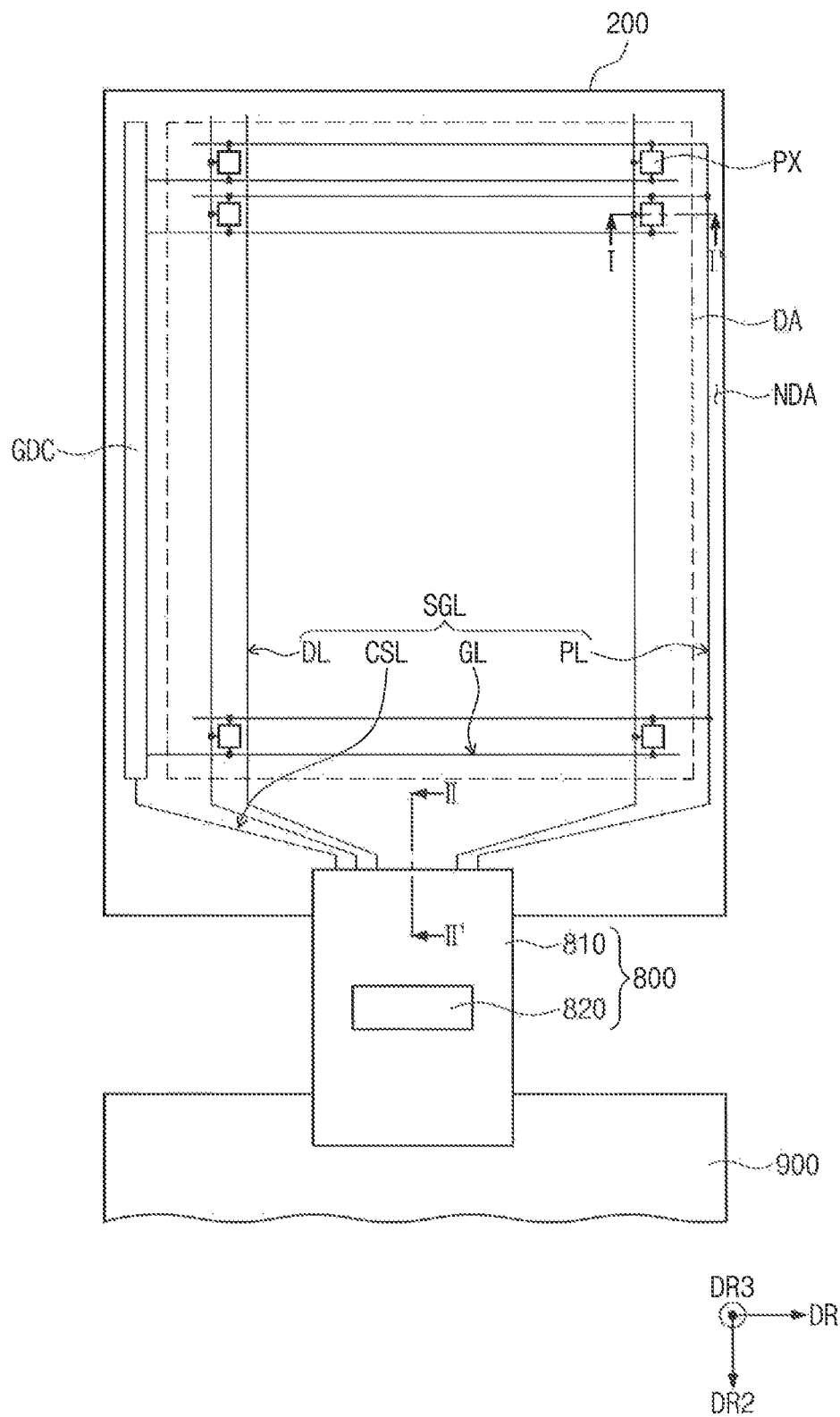
FIG. 2 is a sectional view illustrating a portion of the display device of FIG. 1 according to an exemplary embodiment of the inventive concept.
Figure 3:
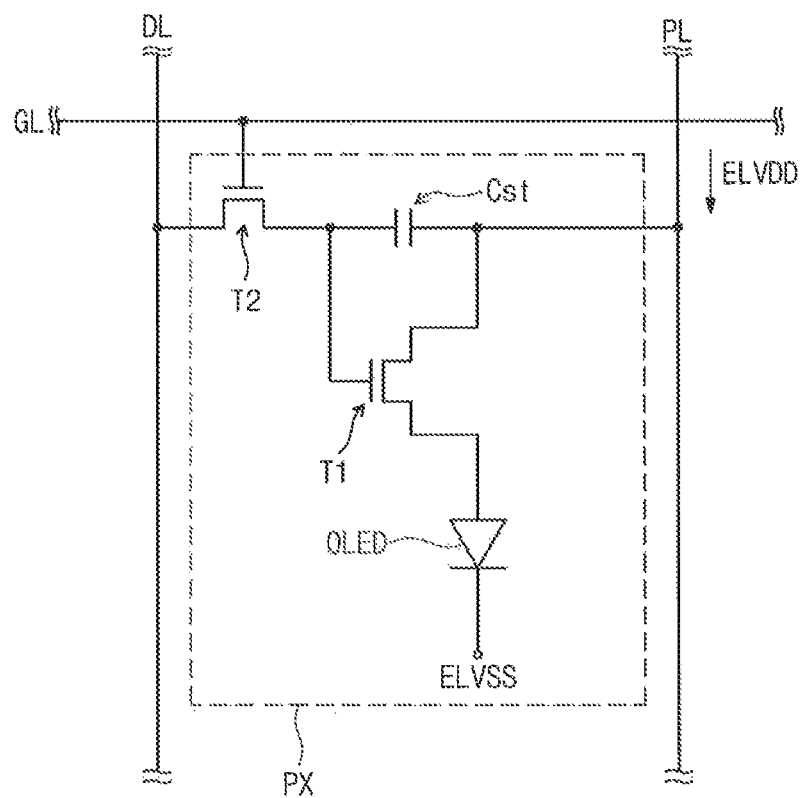
FIG. 3 is an equivalent circuit diagram of a pixel according to an exemplary embodiment of the inventive concept.
Figure 4:
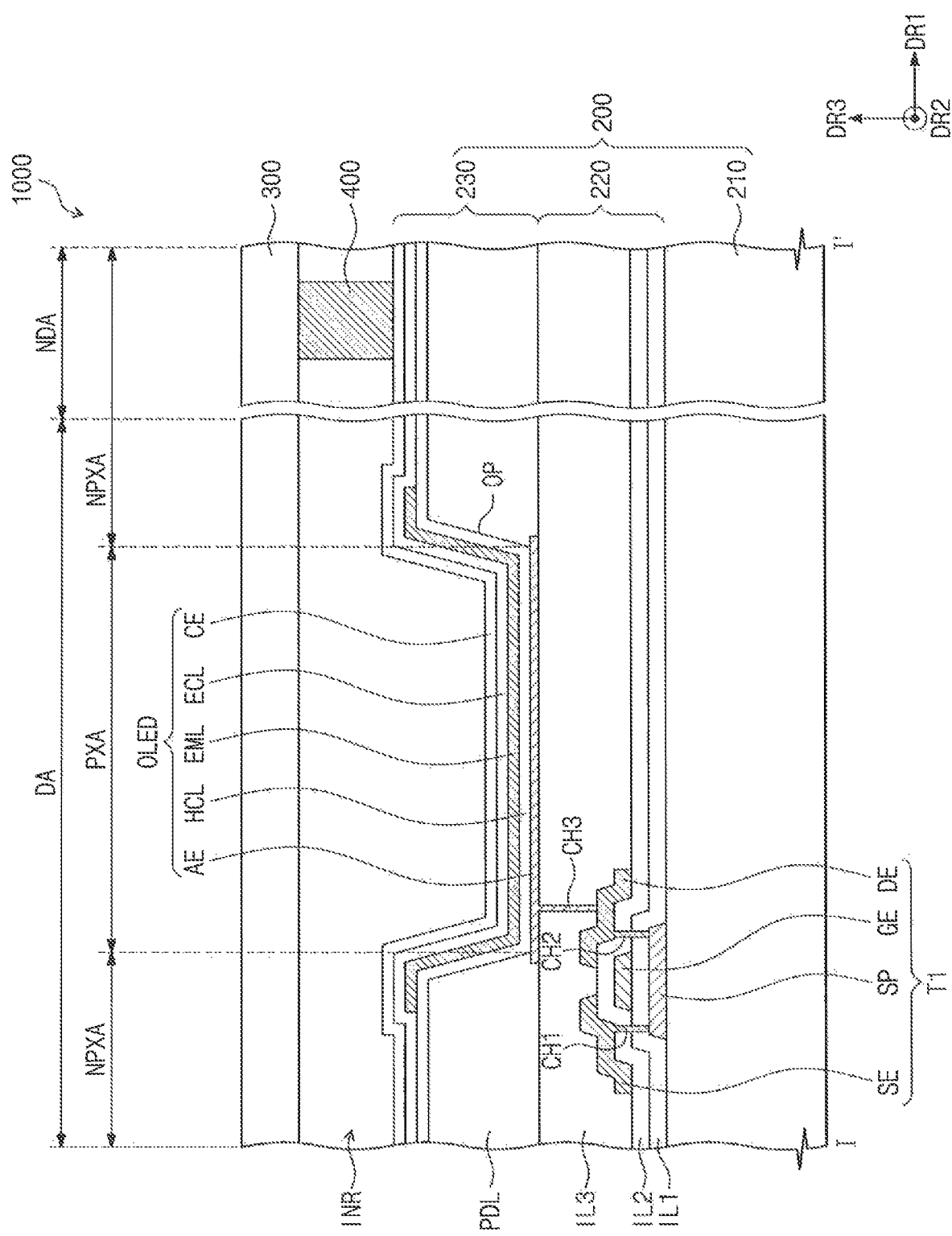
FIG. 4 is a sectional view illustrating a portion of a display device according to an exemplary embodiment of the inventive concept.

FIG. 1 is an exploded perspective view of a display device according to an exemplary embodiment of the inventive concept. FIG. 2 is a sectional view illustrating a portion of the display device of FIG. 1 according to an exemplary embodiment of the inventive concept. FIG. 3 is an equivalent circuit diagram of a pixel according to an exemplary embodiment of the inventive concept. FIG. 4 is a sectional view illustrating a portion of a display device according to an exemplary embodiment of the inventive concept. Hereinafter, a display device 1000 according to an exemplary embodiment of the inventive concept will be described in more detail with reference to FIGS. 1 to 4.

Referring to FIG. 1, the display device 1000 may include a window element 100, a container element 150, a substrate element 200, an encapsulation element 300, a sealing element 400, a filling element 500, an optical element 600, an adhesive element 700, a flexible circuit board 800, and a main circuit board 900.

The window element 100 may be divided into a transmission region AA and a light-blocking region BA, when viewed in a plan view. For example, the plan view may be defined by a first direction DR1 and a second direction DR2. The transmission region AA may be optically transparent. For example, the transmission region AA may have a transmittance of 90% or higher. Light emitted from the substrate element 200 may pass through the transmission region AA and may be recognized by an outer user. In other words, the light that passes through the transmission region AA may be viewed by a person looking at the display device 1000. The light-blocking region BA may be adjacent to the transmission region AA. In the present embodiment, the light-blocking region BA may enclose the transmission region AA. However, the inventive concept is not limited thereto. For example, the light-blocking region BA may be provided near only one side of the transmission region AA. The light-blocking region BA may have various shapes. For example, the inventive concept is not limited to the shape of the light-blocking region BA shown in FIG. 1.

The container element 150 may have an internal space. The substrate element 200, the encapsulation element 300, the sealing element 400, the filling element 500, the optical element 600, the adhesive element 700, the flexible circuit board 800, and the main circuit board 900 may be placed in the internal space of the container element 150. The container element 150 may be coupled to the window element 100. The container element 150 and the window element 100 may define the outside of the display device 1000.

The filling element 500, which is provided to support the window element 100 and the substrate element 200, may also stably maintain a thickness of a gap region between the window element 100 and the substrate element 200. Thus, the filling element 500 may help prevent the display device 1000 from being damaged by an external impact.

The substrate element 200 may include a base layer 210, a circuit layer 220, and a device layer 230. The circuit layer 220 and the device layer 230 may be provided on the base layer 210. The base layer 210 may include a glass substrate, a metal substrate, or a substrate made of an organic/inorganic composite material.

In exemplary embodiments of the inventive concept, the base layer 210 may further include a synthetic resin layer. The synthetic resin layer may include a thermosetting resin.

In addition, at least one inorganic layer, which is used as a barrier layer and/or a buffer layer, may be further provided on the base layer 210. The inorganic layer may be formed of or include aluminum oxide, titanium oxide, silicon oxide, silicon oxynitride, zirconium oxide, or hafnium oxide. The inorganic layer may have a multi-layered structure. The multi-layered inorganic layers may be used as a barrier layer and/or a buffer layer. At least one of the barrier layer and the buffer layer may be omitted from the multi-layered structure.

The barrier layer may prevent an external foreign substance from passing through the barrier layer. The barrier layer may include a silicon oxide layer and a silicon nitride layer. The silicon oxide layer and the silicon nitride layer may be stacked in a sequential or an alternating manner.

The buffer layer may allow a layer, which is placed on or below the buffer layer, to have an increased coupling strength. The buffer layer may include a silicon oxide layer and a silicon nitride layer. The silicon oxide layer and the silicon nitride layer may be stacked alternatingly.

The circuit layer 220 and the device layer 230 may include a driver circuit GDC, a plurality of signal lines SGL, a plurality of pixels PX, and a plurality of signal pads.

The substrate element 200 may include a display region DA, which is provided to display an image produced by the pixels PX, and a non-display region NDA, which is provided adjacent to the display region DA. The display region DA may be overlapped with the transmission region AA of FIG. 1. The non-display region NDA may be overlapped with the light-blocking region BA of FIG. 1.

The driver circuit GDC may be configured to generate a plurality of scan signals and to sequentially output the scan signals to a plurality of scan lines GL. This will be described in more detail below. In addition, the driver circuit GDC may also be configured to output other control signals to the pixels PX.

The signal lines SGL may include scan lines GL, data lines DL, a power line PL, and a control signal line CSL. Each of the scan lines GL may be connected to the pixels PX, e.g., a corresponding row or rows of the pixels PX, and each of the data lines DL may be connected to the pixels PX, e.g., a corresponding column or columns of the pixels PX. The power line PL may be connected to the pixels PX. The control signal line CSL may be connected to a scan driver circuit and may be used to deliver control signals. At least one signal pad may be connected to a corresponding one of the signal lines SGL.

FIG. 3 is an equivalent circuit diagram of a pixel according to an exemplary embodiment of the inventive concept. FIG. 3 illustrates a scan line GL, a data line DL, a power line PL, and a pixel PX connected to the scan, data and power lines GL, DL and PL. In an exemplary embodiment of the inventive concept, the pixel PX may include an organic light emitting diode or a quantum dot light emitting diode serving as a light emitting device. A luminescent layer of the organic light emitting diode may include an organic luminescent material. A luminescent layer of the quantum dot light emitting diode may include quantum dots and quantum rods. For simplicity, the description that follows will refer to an example in which an organic light emitting diode is used as the pixel PX.

The pixels PX may be classified into a plurality of groups, according to display colors of the pixels PX. For example, the pixels PX may include red pixels, green pixels, and blue pixels. In an exemplary embodiment of the inventive concept, the pixels PX may further include white pixels.

The pixel PX may include an organic light emitting diode OLED and a pixel driver circuit for driving the organic light emitting diode OLED. In the present embodiment, the pixel driver circuit may include a first thin-film transistor T1 (or a driving transistor), a second thin-film transistor T2 (or a switching transistor), and a capacitor Cst. A first power voltage ELVDD may be provided to the organic light emitting diode OLED. A second power voltage ELVSS may be lower than the first power voltage ELVDD. The second power voltage ELVSS may be connected to a terminal of the organic light emitting diode OLED.

The first thin-film transistor T1 may be connected to the organic light emitting diode OLED. The first thin-film transistor T1 may be used to control a driving current flowing through the organic light emitting diode OLED, depending on an amount of electric charges stored in the capacitor Cst. The second thin-film transistor T2 may be configured to output a data signal applied to the data line DL, in response to a scan signal applied to the scan line GL. The capacitor Cst may be charged to have a voltage corresponding to the data signal to be output from the second thin-film transistor T2.

The structure of the pixel PX is not limited to that shown in FIG. 3. For example, the structure of the pixel PX may be variously changed. For example, the pixel driver circuit may include three or more thin-film transistors.

FIG. 4 is a sectional view illustrating a portion of a display device according to an exemplary embodiment of the inventive concept. An example of a display device will be described in more detail with reference to FIGS. 1 and 4. The sectional view of FIG. 4 illustrates a portion of the pixel PX, taken along line I-I' of FIG. 2. The first thin-film transistor T1 and the organic light emitting diode OLED, which are parts of the pixel PX, are illustrated in FIG. 4. In addition, FIG. 4 illustrates how the encapsulation element 300 and the sealing element 400 are placed on the substrate element 200.

The first thin-film transistor T1 may include a semiconductor pattern SP, a control electrode GE, an input electrode SE, and an output electrode DE. The semiconductor pattern SP may be provided on the base layer 210. The semiconductor pattern SP may be formed of or include a crystalline semiconductor material or an amorphous silicon.

A first insulating layer IL1 may be provided on the base layer 210. The first insulating layer IL1 may be overlapped with a plurality of the pixels PX (e.g., see FIG. 2) and cover the semiconductor patterns SP of the pixels PX. The first insulating layer IL1 may be an inorganic layer and/or an organic layer and may have a single- or multi-layered structure. The first insulating layer IL1 may be formed of or include aluminum oxide, titanium oxide, silicon oxide, silicon oxynitride, zirconium oxide, or hafnium oxide.

The control electrode GE may be provided on the first insulating layer IL1. The control electrode GE may be overlapped with the semiconductor pattern SP.

A second insulating layer IL2 may be provided on the first insulating layer IL1. The second insulating layer IL2 may cover the first insulating layer IL1 and the control electrode GE. The second insulating layer IL2 may be overlapped with the plurality of the pixels PX (e.g., see FIG. 2). The second insulating layer IL2 may be an inorganic layer and/or an organic layer and may have a single- or multi-layered structure. The second insulating layer IL2 may be formed of or include aluminum oxide, titanium oxide, silicon oxide, silicon oxynitride, zirconium oxide, or hafnium oxide.

The input electrode SE and the output electrode DE may be provided on the second insulating layer IL2. Each of the input and output electrodes SE and DE may be connected to the semiconductor pattern SP through a corresponding one of contact holes CH1 and CH2, which are formed in the insulating layers IL1 and IL2.

A third insulating layer IL3 may be provided on the second insulating layer IL2 to cover the first thin-film transistor T1. The third insulating layer IL3 may be an inorganic layer and/or an organic layer and may have a single- or multi-layered structure. The third insulating layer IL3 may be formed of or include aluminum oxide, titanium oxide, silicon oxide, silicon oxynitride, zirconium oxide, or hafnium oxide.

The organic light emitting diode OLED may be provided on the third insulating layer IL3. The organic light emitting diode OLED may include a first electrode AE, a first charge control layer HCL, a luminescent layer EML, a second charge control layer ECL, and a second electrode CE. In the present embodiment, the first electrode AE may correspond to an anode electrode, and the second electrode may correspond to a cathode electrode CE of the organic light emitting diode OLED. The first charge control layer HCL may be hole control layer and second charge control layer ECL may be an electron control layer ECL.

However, the inventive concept is not limited to the above example. For example, the first electrode AE, the first charge control layer HCL, the luminescent layer EML, the second charge control layer ECL, and the second electrode CE may be used as a cathode electrode, an electron control layer, a luminescent layer, a hole control layer, and an anode electrode, respectively.

The first electrode AE may be connected to the output electrode DE through a third contact hole CH3, which is formed to penetrate the third insulating layer IL3.

A pixel definition layer PDL may be provided on the third insulating layer IL3. The pixel definition layer PDL may have an opening OP exposing at least a portion of the first electrode AE. The opening OP of the pixel definition layer PDL may define a light emitting region PXA of the pixel PX. Regions, in which the pixels PX are provided, may be referred to as 'pixel regions', and each of the pixel regions may include the light emitting region PXA and a non-light-emitting region NPXA adjacent to the light-emitting region PXA. The non-light-emitting region NPXA may enclose the light emitting region PXA. Each of the light emitting region PXA and the non-light-emitting region NPXA, which are provided in each of the pixels PX, may be overlapped with the display region DA shown in FIG. 2.

The first charge control layer HCL may be commonly provided in the light emitting region PXA and the non-light-emitting region NPXA. A common layer, such as the first charge control layer HCL, may cover a plurality of the pixels PX in common. The first charge control layer HCL may be used to control hole motion. For example, the first charge control layer HCL may include a hole transport layer and a hole injection layer.

The luminescent layer EML may be provided on the first charge control layer HCL. The luminescent layer EML may be locally provided on only a region corresponding to the opening OP. For example, the luminescent layer EML may be divided into a plurality of patterns that are formed in the plurality of pixels PX, respectively.

The second charge control layer ECL may be provided on the luminescent layer EML. The second charge control layer ECL may be used to control electron motion. For example, the second charge control layer ECL may include an electron transport layer and an electron injection layer.

The second electrode CE may be provided on the second charge control layer ECL. The second electrode CE may be a common electrode or a negative electrode.

In the case where the organic light emitting diode OLED is a top-emission type organic light emitting diode OLED, the first electrode AE may be a reflective electrode and the second electrode CE may be a transparent or transflective electrode. In the case where the organic light emitting diode OLED is a bottom-emission type organic light emitting diode OLED, the first electrode AE may be a transparent or transflective electrode and the second electrode CE may be a reflective electrode.

The encapsulation element 300 may be provided on the substrate element 200. The encapsulation element 300 may cover the display region DA. The encapsulation element 300 may be provided in the form of a glass or plastic substrate. However, the inventive concept is not limited thereto. For example, the encapsulation element 300 may be formed of or include organic or inorganic materials.

The substrate and encapsulation elements 200 and 300 may be connected to each other by the sealing element 400. The sealing element 400 may be provided along edge regions of the encapsulation element 300, which are parallel to the first direction DR1 or the second direction DR2. In an exemplary embodiment of the inventive concept, when viewed in a plan view, the edge regions may be outer regions of the encapsulation element 300 overlapped with the non-display region NDA of the substrate element 200. The sealing element 400 may include a frit. The sealing element 400, along with the encapsulation element 300, may prevent the organic light emitting diode OLED from being exposed to external moisture and air.

The sealing element 400 may have a specific thickness in an area between the substrate and encapsulation elements 200 and 300. Thus, the substrate element 200, the encapsulation element 300, and the sealing element 400 may define an internal space INR. The internal space INR may be substantially maintained in a vacuum state. However, the inventive concept is not limited thereto, and the internal space INR may be filled with nitrogen gas ($N_2$) or an insulating material. In an exemplary embodiment of the inventive concept, the sealing element 400 may be overlapped with the non-display region NDA of FIG. 2. For example, the sealing element 400 may be provided between the substrate and encapsulation elements 200 and 300 and may be overlapped with the non-display region NDA, when viewed in a plan view. Although FIG. 4 illustrates an example in which the sealing element 400 is directly provided on the second electrode CE, the inventive concept is not limited to this example. As an example, an insulating layer, which is formed of inorganic or organic materials, may be provided to cover the second electrode CE, and the sealing element 400 may be provided on the insulating layer covering the second electrode CE. Furthermore, in an exemplary embodiment of the inventive concept, the pixel definition layer PDL and the insulating layers IL1, IL2, and IL3 may be omitted from a region corresponding to the non-display region NDA of FIG. 4. In this case, the sealing element 400 may be directly provided on the base layer 210.

The filling element 500 may be provided between the window element 100 and the substrate element 200. The filling element 500 may fill a gap region between the window element 100 and the substrate element 200. In addition, since the filling element 500 is used to stably maintain a thickness of a gap region between the window element 100 and the substrate element 200, the filling element 500 can be used to stably protect the device layer 230 from an external impact. The filling element 500 may be formed of or include an insulating material. For example, the filling element 500 may be formed of or include photo- or thermo-curable materials. The filling element 500 will be described in more detail below.

The optical element 600 may be provided between the window element 100 and the encapsulation element 300. The optical element 600 may be overlapped with the transmission region AA. The optical element 600 may be configured to increase brightness of an image generated by the device layer 230 or to suppress visibility deterioration, which is caused by the reflection of external light. For example, the optical element 600 may include a polarization film, an optical compensation film, or a color filter. The adhesive element 700 may be provided between the optical element 600 and the window element 100. The adhesive element 700 may be used to attach the window element 100 to the optical element 600. The adhesive element 700 may be overlapped with the transmission region AA.

Accordingly, the adhesive element 700 may include a transparent adhesive material. For example, the adhesive element 700 may include an optical clear adhesive (OCA), an optical transparent resin (OCR), or a pressure sensitive adhesive (PSA).

The flexible circuit board 800 may include a flexible film 810 and a driver chip 820. The flexible circuit board 800 may be provided near one side of the substrate element 200 and may include output pads, which are coupled to the signal pads. Thus, the flexible circuit board 800 may be used to electrically connect at least one of the signal lines SGL to the main circuit board 900.

The flexible film 810 may have a flexible property and may include a plurality of circuit lines.

The driver chip 820 may be mounted on the flexible film 810 in a chip-on-film (COF) manner. The driver chip 820 may include driving devices (e.g., a data driver circuit) for driving the pixels PX. Although one flexible circuit board 800 is illustrated, the inventive concept is not limited thereto. For example, a plurality of flexible circuit boards 800 may be coupled to the substrate element 200.

The main circuit board 900 may be coupled to input pads of the flexible circuit board 800 and may be electrically connected to at least one of the signal lines SGL through the flexible circuit board 800. In an exemplary embodiment of the inventive concept, the main circuit board 900 may be a flexible printed circuit board (FPCB).

The main circuit board 900 may include a signal control unit (e.g., a timing controller). The signal control unit may be configured to receive input image signals and to convert the input image signals to image data suitable for operations of the pixels PX. In addition, the signal control unit may also be configured to receive a variety of control signals (e.g., a vertical synchronization signal, a horizontal synchronization signal, a main clock signal, and a data enable signal) and to output the control signals.

Figure 5:
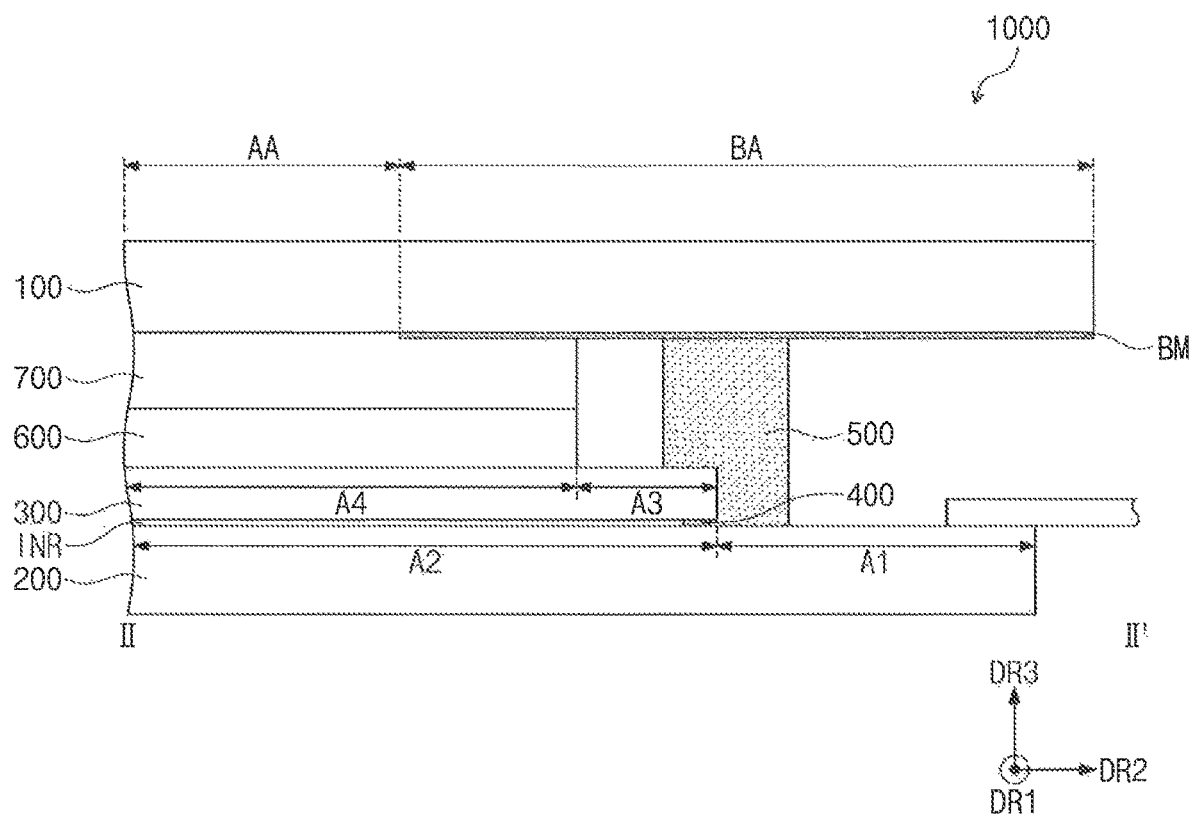
FIG. 5 is a sectional view of a display device according to an exemplary embodiment of the inventive concept.
Figure 6:
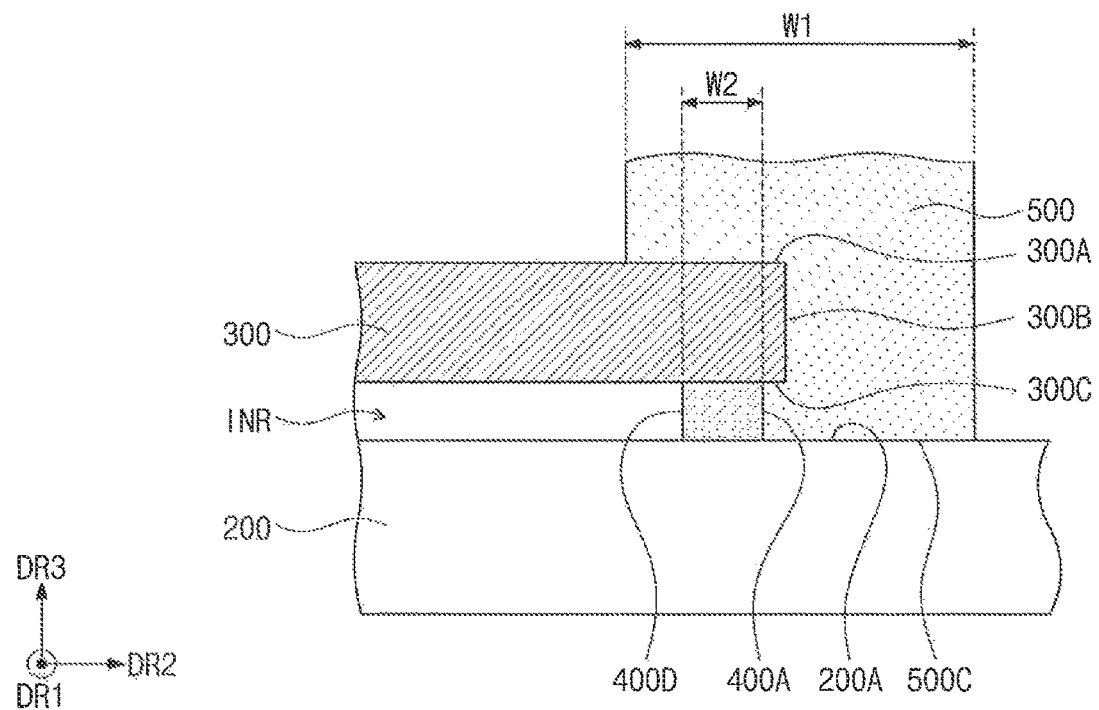
FIG. 6 is an enlarged sectional view illustrating a portion of a display device according to an exemplary embodiment of the inventive concept.

FIG. 5 is a sectional view of a display device according to an exemplary embodiment of the inventive concept. FIG. 6 is an enlarged sectional view illustrating a portion of a display device according to an exemplary embodiment of the inventive concept. Hereinafter, the display device 1000 will be described with reference to FIGS. 5 and 6. In the following description, the sealing element 400 is illustrated in an enlarged manner.

In the present embodiment, a first region A1 and a second region A2 may be defined in the substrate element 200. A portion of the first region A1 may not be covered by the encapsulation element 300 and a portion of the first region A1 may be overlapped with a portion of the filling element 500. The second region A2 may be adjacent to the first region A1 in the second direction DR2 and may be covered with the encapsulation element 300.

A third region A3 and a fourth region A4 may be defined in the encapsulation element 300. The third region A3 may not be covered by the optical element 600 and may be overlapped with a portion of the filling element 500. The fourth region A4 may be adjacent to the third region A3 in the second direction DR2 and may be covered with the optical element 600. In the present embodiment, the filling element 500 may be overlapped with a portion of each of the window and substrate elements 100 and 200. The filling element 500 may be spaced apart from the optical element 600 and the adhesive element 700.

In the present embodiment, a light-blocking layer BM may be provided on the light-blocking region BA. The light-blocking layer BM may be formed of or include a black material. The light-blocking layer BM may be provided under the window element 100 and may be formed by a printing or deposition process. In an exemplary embodiment of the inventive concept, the filling element 500 may be overlapped with the light-blocking layer BM and may be overlapped with a portion of each of the first region A1 and the third region A3. When measured in the second direction DR2, a width W1 (hereinafter, a first width) of the filling element 500 may be greater than a width W2 (hereinafter, a second width) of the sealing element 400. When viewed in a plan view, the filling element 500 may cover the sealing element 400.

As shown in FIG. 6, a bottom surface 500C (or bottom area) of the filling element 500 may be in direct contact with a portion of a top surface 300A, a side surface 300B, and a portion of a bottom surface 300C of the encapsulation element 300. In addition, the bottom surface 500C (or bottom area) of the filling element 500 may be in direct contact with an outer side surface 400A of the sealing element 400, and a portion of a top surface 200A of the substrate element 200. In the present embodiment, an inner side surface 400D of the sealing element 400 facing the outer side surface 400A, along with the substrate and encapsulation elements 200 and 300, may define the internal space INR that is hermetically sealed. In other words, the inner side surface 400D may be closer to the organic light emitting diode OLED (e.g., see FIG. 4) than the outer side surface 400A.

Since the display device 1000 includes the filling element 500 that is in direct contact with the outer side surface 400A of the sealing element 400, it is possible to prevent the sealing element 400 from having a weakened adhesion strength due to an external impact or a foreign substance. In addition, since the display device 1000 includes the filling element 500 that is in direct contact with the outer side surface 400A of the sealing element 400, it is possible to prevent the substrate element 200 and the encapsulation element 300 from being decoupled from each other due to the cracking of the sealing element 400. In addition, since the filling element 500 is used to maintain a gap region between the substrate element 200 and the window element 100, it is possible to increase a mechanical strength of the display device 1000.

During a fabrication process, there may be a difference in curing levels and materials between the filling and adhesive elements 500 and 700. Thus, in the case where the filling element 500 is in partial contact with the adhesive element 700, due to a difference in refractive index between a contacting portion and a non-contacting portion, the contacting portion may be recognized by an external user. Such recognition by the external user is unwanted. According to an exemplary embodiment of the inventive concept, since the filling element 500 is provided adjacent to the adhesive element 700, it is possible to prevent the filling and adhesive elements 500 and 700, which are formed of different materials, from being mixed with each other in a curing step. Therefore, the contacting portion is prevented from being recognized by a user. As a result, it is further possible to provide the display device 1000 with increased reliability.

Figure 7:
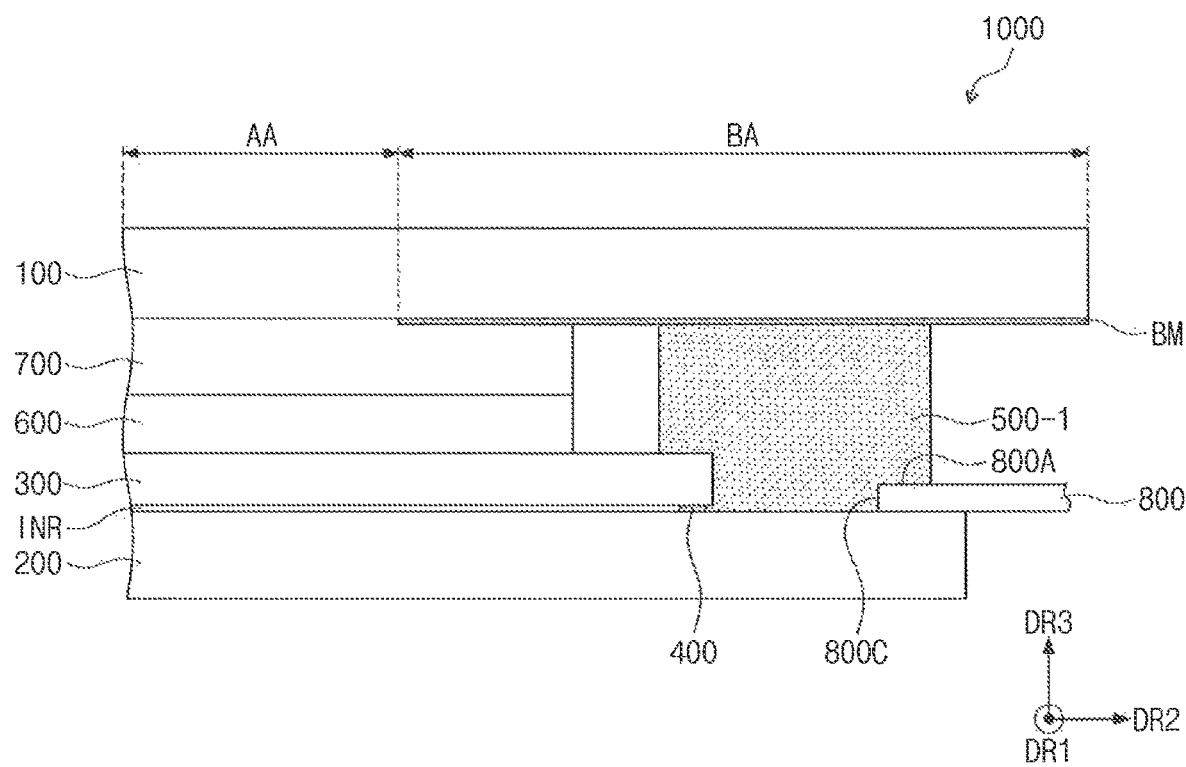
FIG. 7 is a sectional view of a display device according to an exemplary embodiment of the inventive concept.

FIG. 7 is a sectional view of a display device according to an exemplary embodiment of the inventive concept. Hereinafter, an element previously described with reference to FIGS. 1 to 6 identified by the same reference number in FIG. 7 may not be repeatedly described. In an exemplary embodiment of the inventive concept, a filling element 500-1 may be overlapped with a portion of the light-blocking region BA of the window element 100 and portions of the substrate and encapsulation elements 200 and 300. The filling element 500-1 may partially cover a top surface 800A and a side surface 800C of the flexible circuit board 800. In the present embodiment, since the filling element 500-1 covers the flexible circuit board 800, it is possible to prevent an external foreign substance from entering the display device 1000 and to increase a mechanical strength of the display device 1000.

Figure 8:
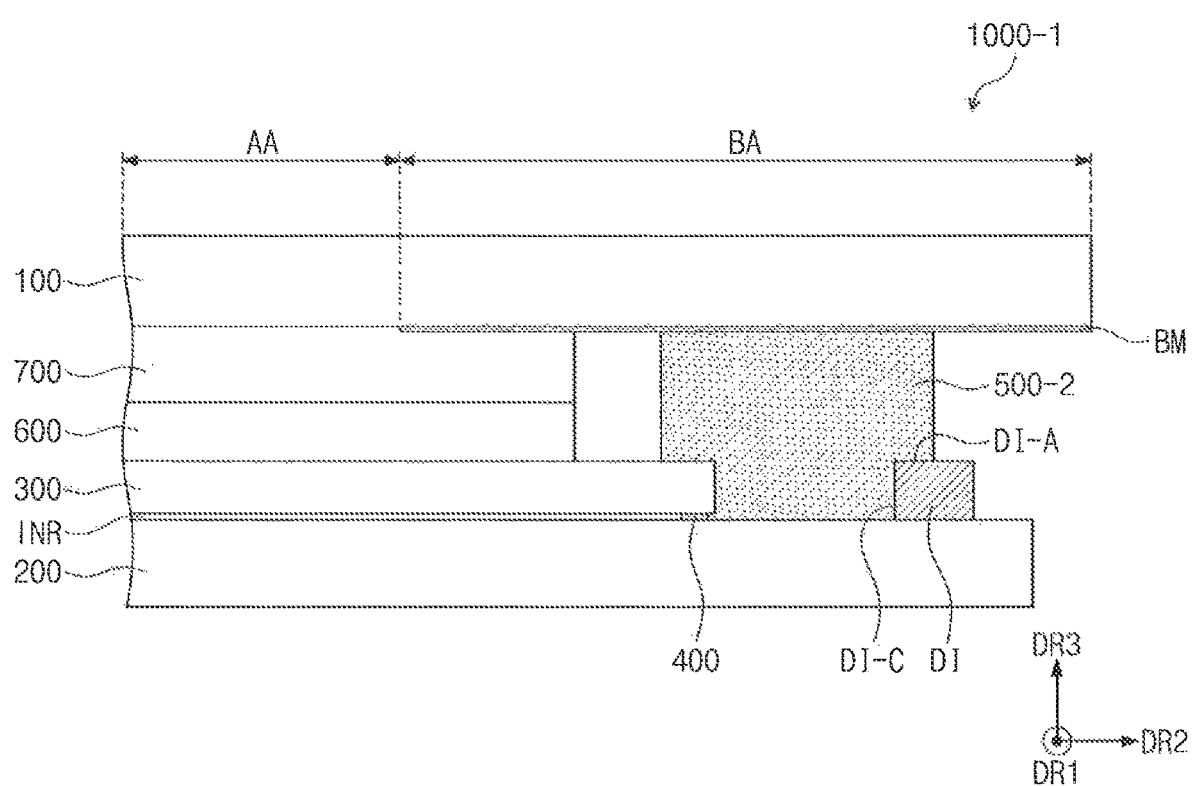
FIG. 8 is a sectional view of a display device according to an exemplary embodiment of the inventive concept.

FIG. 8 is a sectional view of a display device according to an exemplary embodiment of the inventive concept. Hereinafter, an element previously described with reference to FIGS. 1 to 6 identified by the same reference number in FIG. 8 may not be repeatedly described.

According to an exemplary embodiment of the inventive concept, a display device 1000-1 may further include a driver chip DI. In the present embodiment, the driver chip DI may include driving devices (e.g., a data driver circuit) for driving the pixels PX.

In the present embodiment, a filling element 500-2 may be provided to partially cover a top surface DI-A and a side surface DI-C of the driver chip DI. However, the inventive concept is not limited to this example. For example, the filling element 500-2 may be provided to wholly cover the driver chip DI. Since the filling element 500-2 is provided to partially or wholly cover the sealing element 400 and the driver chip DI, it is possible to increase a mechanical strength of the display device 1000-1.

Figure 9:
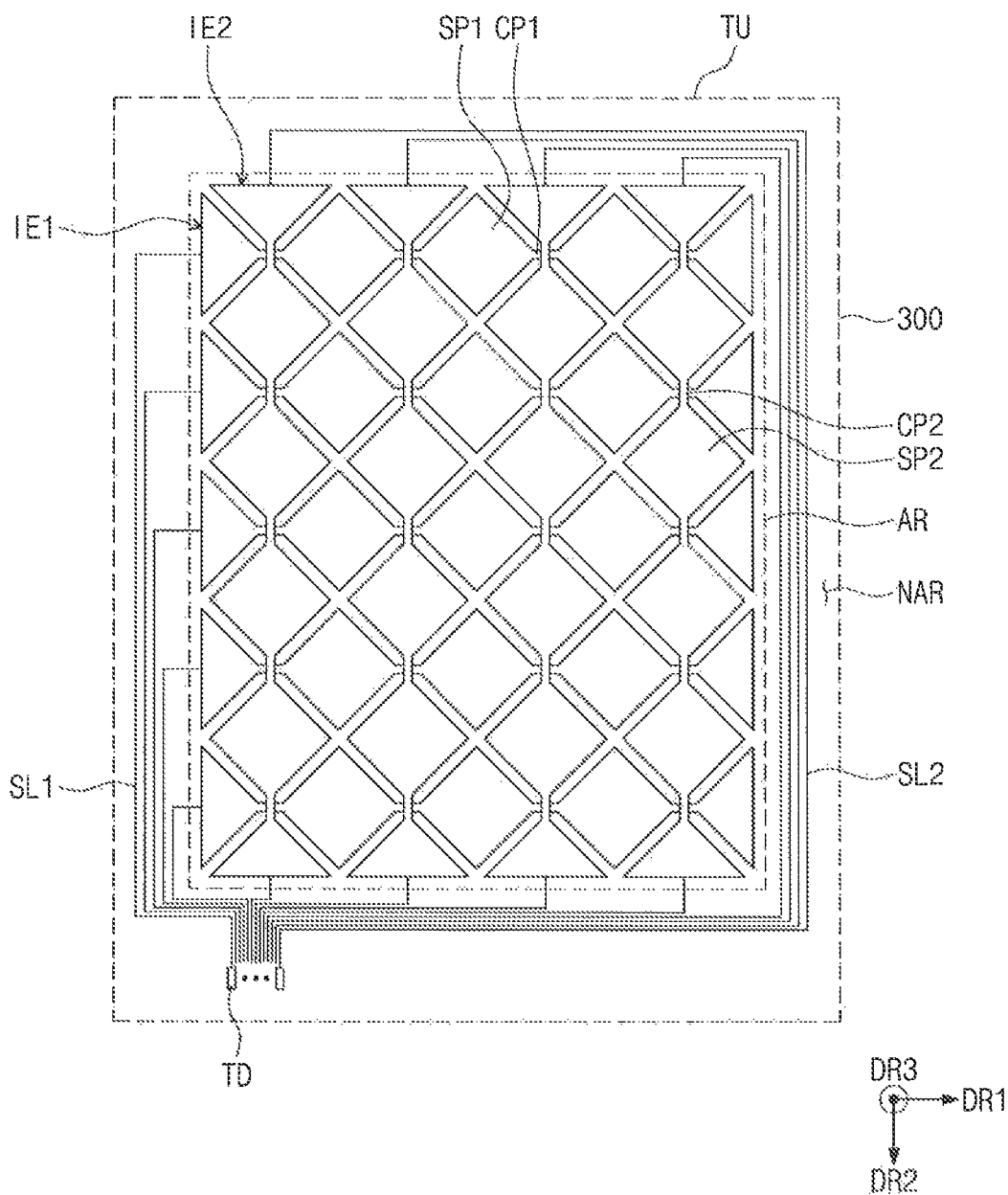
FIG. 9 is a plan view illustrating a portion of a display device according to an exemplary embodiment of the inventive concept.

FIG. 9 is a plan view illustrating a touch unit of a display device according to an exemplary embodiment of the inventive concept.

A touch unit TU may be configured to obtain information on coordinates of an external input. The touch unit TU may be directly provided on the encapsulation element 300. In an exemplary embodiment of the inventive concept, the touch unit TU may be directly formed on the encapsulation element 300. Accordingly, an additional adhesive layer between the touch unit TU and the encapsulation element 300 may be omitted. However, the inventive concept is not limited thereto. For example, the touch unit TU may be provided in the form of an individual panel and may be coupled to the encapsulation element 300 through an additional adhesive element.

The touch unit TU may include a touch sensor, in which a plurality of conductive layers are provided, and a plurality of insulating layers. Each of the insulating layers may have a single-layered structure or a multi-layered structure including layers, which are stacked in a third direction DR3.

The touch unit TU may include an active region AR, which is used to sense an external input corresponding to the transmission region AA of FIG. 1, and a non-active region NAR, which is provided to surround the active region AR. The active region AR and the non-active region NAR may correspond to the transmission region AA and the light-blocking region BA, respectively, of FIG. 1.

One of the conductive layers of the touch sensor may include first sensing electrodes IE1 and first signal lines SL1, which are connected to the first sensing electrodes IE1, and another conductive layer of the touch sensor may include second sensing electrodes IE2 and second signal lines SL2, which are connected to the second sensing electrodes IE2.

The first sensing electrodes IE1 and the second sensing electrodes IE2 may cross each other. The first sensing electrodes IE1 may be arranged in the second direction DR2, and each of the first sensing electrodes IE1 may be extended in the first direction DR1. The touch unit TU may be configured to sense an external input in a mutual-capacitance and/or self-capacitance manner.

Each of the first sensing electrodes IE1 may include first sensor units SP1 and first connecting portions CPL. Each of the second sensing electrodes IE2 may include second sensor units SP2 and second connecting portions CP2.

In an exemplary embodiment of the inventive concept, the first sensing electrodes IE1 and the second sensing electrodes IE2 may have a shape (e.g., a bar shape), in which the sensor unit and the first and second connecting portions CP1 and CP2 are not distinguished. The first sensor units SP1 and the second sensor units SP2 are illustrated to have a diamond shape, but the inventive concept is not limited thereto. For example, at least one of the first and second sensor units SP1 and SP2 may have a polygonal shape.

The first signal lines SL1 and the second signal lines SL2 may be overlapped with the active region AR and the non-active region NAR. The first signal lines SL1 and the second signal lines SL2 may be connected to corresponding touch pads TD, respectively.

FIGS. 10 to 12B are plan views, each of which illustrates a portion of a display device according to an exemplary embodiment of the inventive concept. Hereinafter, an element previously described with reference to FIGS. 1 to 5 identified by the same reference number in FIGS. 10 to 12B may not be repeatedly described.

In an exemplary embodiment of the inventive concept, the display device 1000 may further include a touch flexible circuit board TF, which is coupled to the touch pads TD of FIG. 9. The touch flexible circuit board TF may be provided at an edge region of the encapsulation element 300 (e.g., the third region A3 of FIG. 5) and may be used to electrically connect the touch unit TU to the main circuit board 900 (e.g., see FIG. 1). The touch flexible circuit board TF may have a flexible property and may include a plurality of circuit lines. The touch flexible circuit board TF may be used to deliver touch sensing signals from the main circuit board 900 to the touch unit TU.

Figure 10:
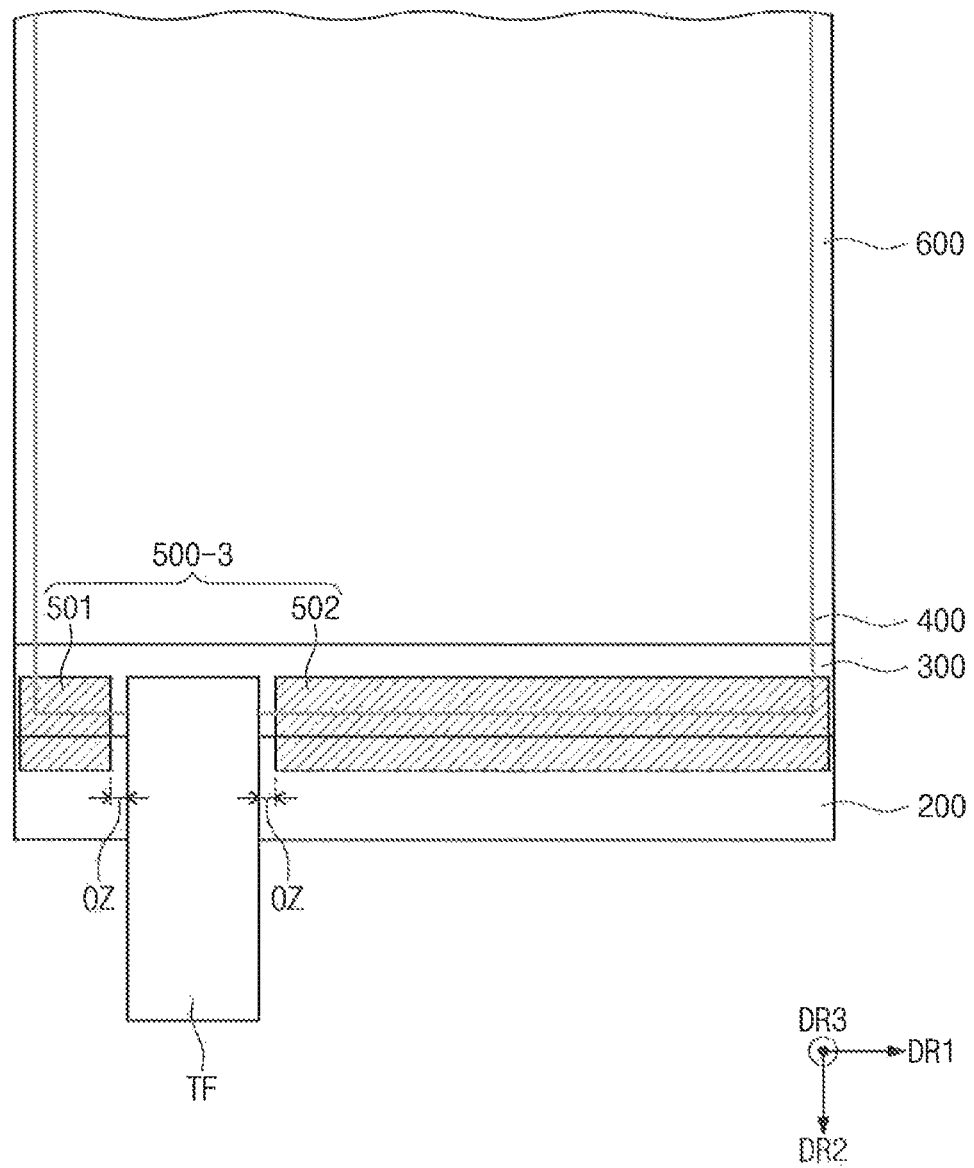
FIG. 10 is a plan view illustrating a portion of a display device according to an exemplary embodiment of the inventive concept.

In an exemplary embodiment of the inventive concept, a plurality of filling elements 500-3 may be provided, as shown in FIG. 10. The filling elements 500-3 may include a first filling element 501 and a second filling element 502, which are spaced apart from each other with the touch flexible circuit board TF interposed therebetween. Each of the first and second filling elements 501 and 502 may be spaced apart from the touch flexible circuit board TF by a separation space OZ. The filling elements and the touch flexible circuit board TF in FIGS. 11A to 12B may be arranged in the same manner as those described with reference to FIG. 10. Accordingly, descriptions thereof may be omitted below.

In the present embodiment, since the touch flexible circuit board TF is not in contact with the first and second filling elements 501 and 502, it is possible to prevent or suppress a material of the first and second filling elements 501 and 502 from entering a space between the touch flexible circuit board TF and the substrate element 200 due to a capillary phenomenon, which may occur when the first and second filling elements 501 and 502 are formed.

Figure 11A:
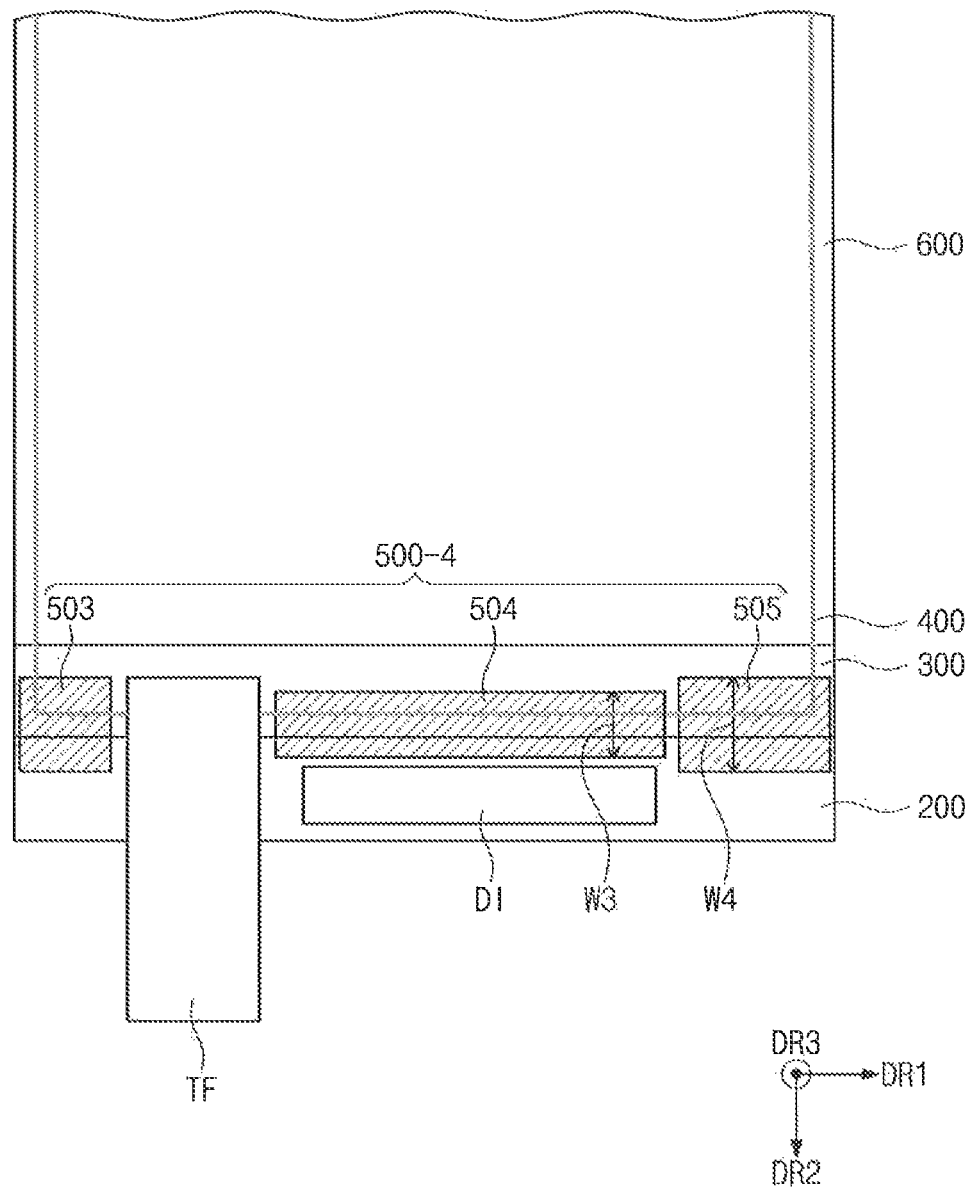
FIGS. 11A and 11B are plan views, each of which illustrates a portion of a display device according to an exemplary embodiment of the inventive concept.

In an exemplary embodiment of the inventive concept, a plurality of filling elements 500-4 may be provided, as shown in FIG. 11A. For example, the filling elements 500-4 may include a third filling element 503 and a fourth filling element 504, which are spaced apart from each other with the touch flexible circuit board TF interposed therebetween, and a fifth filling element 505. The fourth filling element 504 may be overlapped with the driver chip DI (e.g., see also FIG. 8), when viewed in the second direction DR2. However, the fourth filling element 504 and the driver chip DI may be spaced apart from each other, when viewed in a plan view. When measured in the second direction DR2, a third width W3 of the fourth filling element 504 may be smaller than a fourth width W4 of the fifth filling element 505.

The adhesive element 700 (e.g., see FIG. 1) may be cured by ultraviolet light incident through the side surface of the display device 1000. The ultraviolet light may be incident through a space between the driver chip DI and the window element 100. In this case, a transmission amount of the ultraviolet light may be decreased depending on a thickness of the driver chip DI. In the present embodiment, a width of the fourth filling element 504 (e.g., W3) overlapped with the driver chip DI in the second direction DR2 may be decreased. In this case, it is possible to reduce the transmission amount of the ultraviolet light, which is caused by the thickness of the driver chip DI, and thereby to suppress a reduction in a curing rate of the adhesive element 700.

Figure 11B:
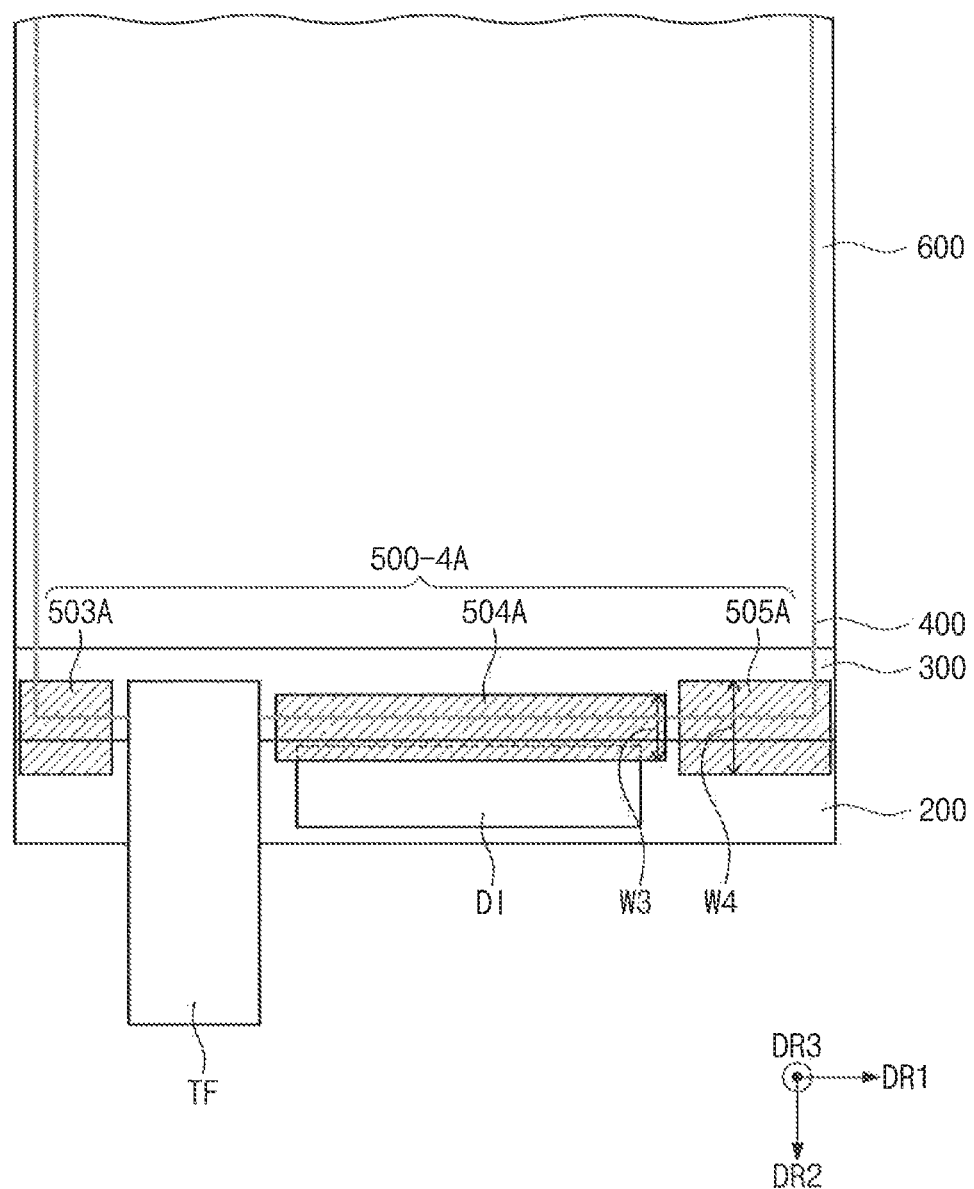

Referring to FIG. 11B, a plurality of filling elements 500-4A may include a third filling element 503A, a fourth filling element 504A, and a fifth filling element 505A. At least a portion of the fourth filling element 504A is overlapped with the driver chip DI when viewed in a plan view. In addition, when viewed in a plan view, the fourth filling element 504A may fully cover the driver chip DI. Thus, it is possible to prevent a foreign substance from entering the driver chip DI. Furthermore, since at least a portion of the driver chip DI is covered with the fourth filling element 504A, it is possible to increase a mechanical strength of the display device 1000.

Figure 12A:
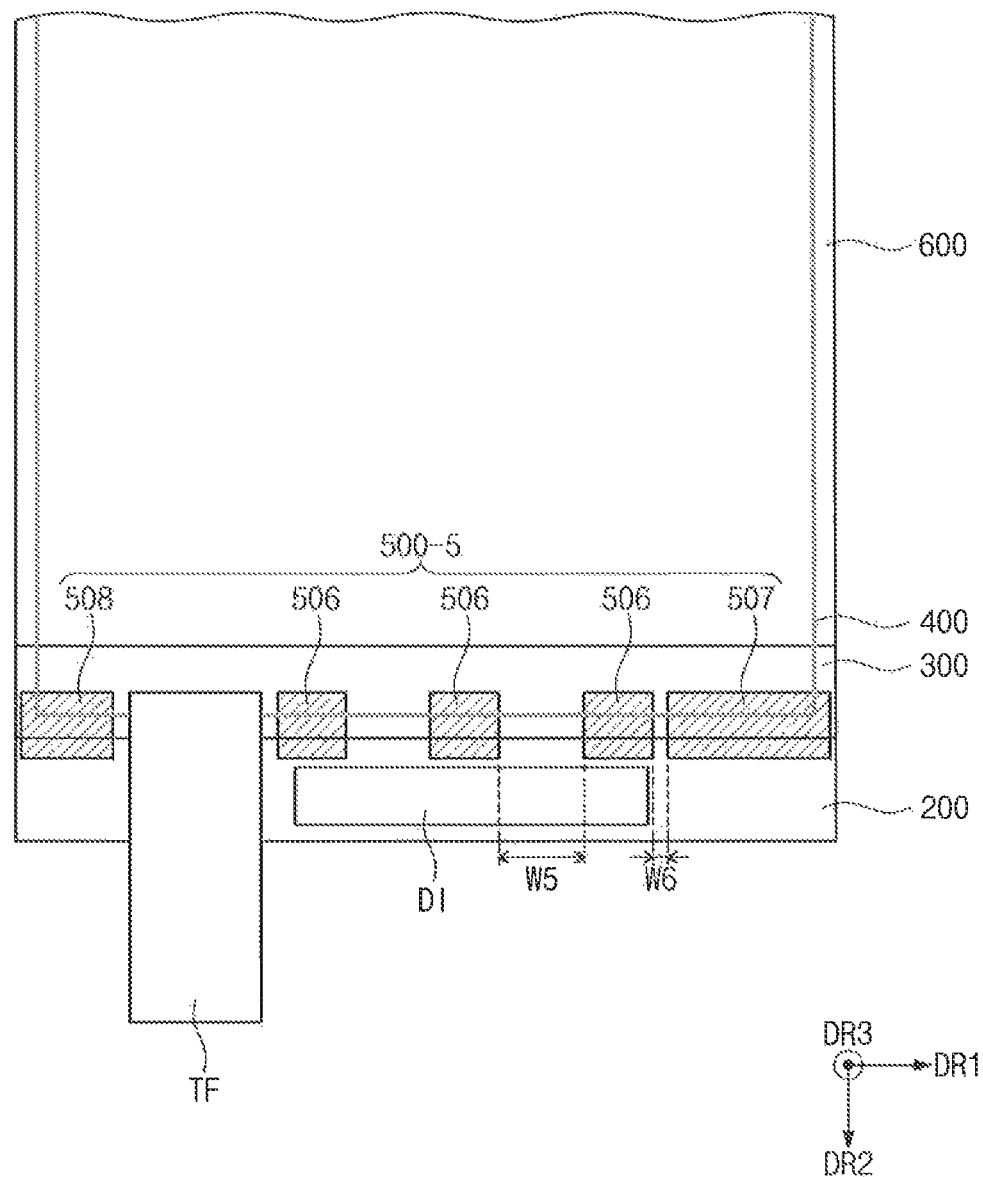
FIGS. 12A and 12B are plan views, each of which illustrates a portion of a display device according to an exemplary embodiment of the inventive concept.

In an exemplary embodiment of the inventive concept, as shown in FIG. 12A, filling elements 500-5 may be dot-shaped patterns, and at least two (e.g., 508 and 506) of the filling elements 500-5 may be spaced apart from each other with the touch flexible circuit board TF interposed therebetween. The dot-shaped filling elements 500-5 may have different shapes. In the present embodiment, the filling elements 500-5 may include sixth filling elements 506, which are overlapped with the driver chip DI in the second direction DR2, and a seventh filling element 507, which is not overlapped with the driver chip DI. When measured in the first direction DR1, a distance (hereinafter, a fifth width W5) between the sixth filling elements 506 may be larger than a distance (hereinafter, a sixth width W6) between the seventh filling element 507 and one of the sixth filling elements 506 adjacent to the seventh filling element 507.

Figure 12B:
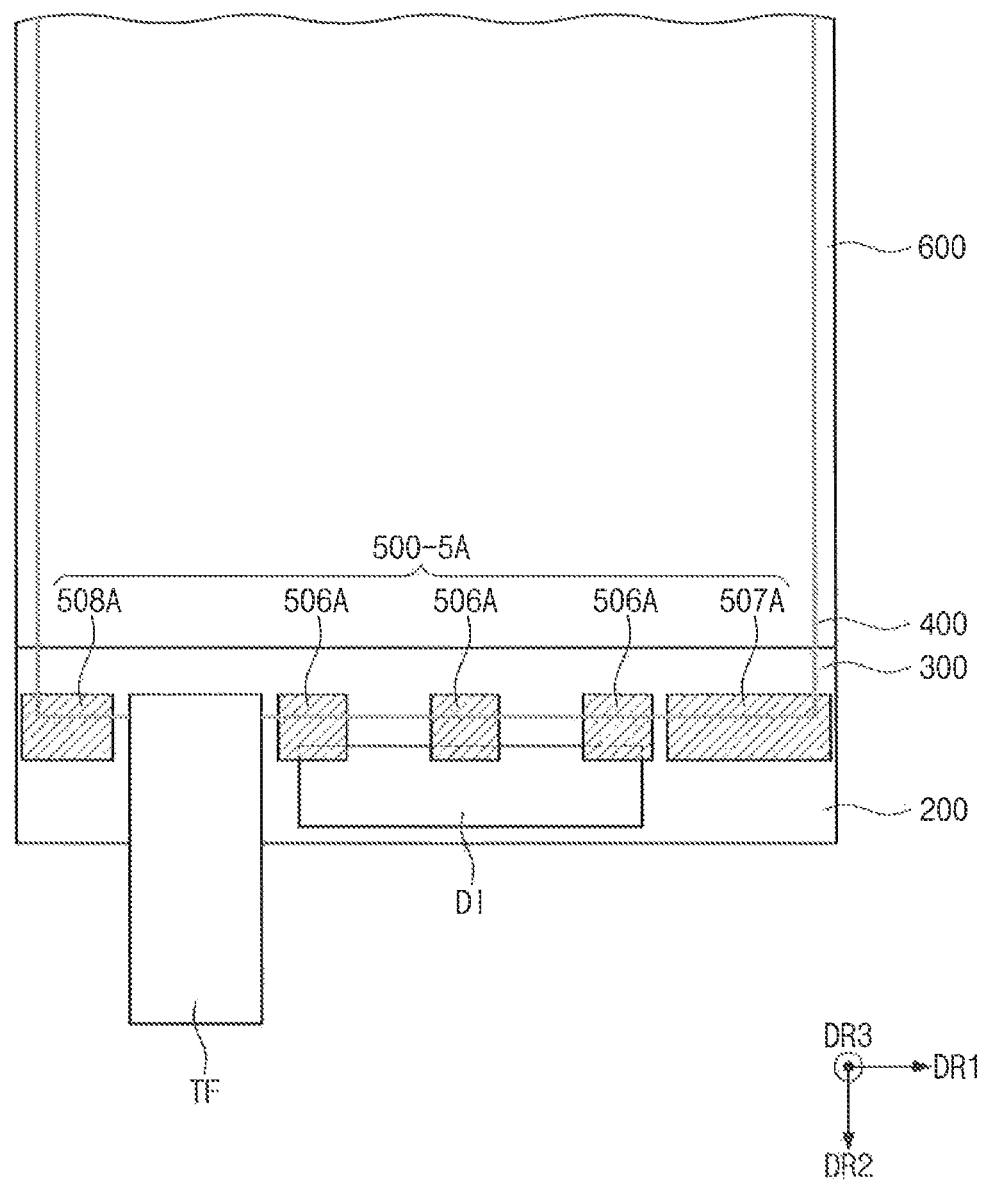

Referring to FIG. 12B, a plurality of filling elements 500-5A may include sixth filling elements 506A, seventh filling elements 507A and eighth filling elements 508A. At least a portion of sixth filling elements 506A is overlapped with the driver chip DI, when viewed in a plan view. In addition, when viewed in a plan view, at least one of the sixth filling elements 506A may fully cover the driver chip DI. Thus, it is possible to prevent a foreign substance from entering the driver chip DI. Furthermore, since at least a portion of the driver chip DI is covered with the sixth filling elements 506A, it is possible to increase a mechanical strength of the display device 1000.

The adhesive element 700 (e.g., see FIG. 1) may be cured by ultraviolet light incident through the side surface of the display device 1000. The ultraviolet light may be incident through a space between the driver chip DI and the window element 100. Here, a distance between the filling elements 500-5A overlapped with the driver chip DI may be increased. Therefore, it is possible to reduce the transmission amount of the ultraviolet light, due to the thickness of the driver chip DI, and to suppress a reduction in a curing rate of the adhesive element 700.

According to exemplary embodiments of the inventive concept, it is possible to stably maintain a thickness of a gap region between a window element 100 and a substrate element 200 and thereby to stably protect a device layer 230 from an external impact. Furthermore, it is possible to protect a sealing element 400, which is used to connect the substrate element 200 to an encapsulation element 300, and to prevent a display device 1000 from failure due to external moisture or contamination. As a result, it is possible to increase operation reliability of the display device 1000.

While the inventive concept has been particularly shown and described with reference to exemplary embodiments thereof, it will be understood by one of ordinary skill in the art that variations in form and detail may be made thereto without departing from the spirit and scope of the inventive concept as defined by the attached claims.

What is claimed is:

1. A display device, comprising:
   a substrate element including a base layer, a circuit layer on the base layer, and a device layer electrically connected to the circuit layer;
   an encapsulation element disposed on the substrate element to cover the device layer;
   a driver chip mounted on the substrate element and comprising a top surface, a first side surface facing the encapsulation element, and a second side surface opposing the first side surface;
   a window element disposed on the encapsulation element; and
   a first filling element disposed between the window element and the substrate element,
   wherein the first filling element contacts a side surface of the encapsulation element, a portion of a top surface of the encapsulation element, and a portion of the top surface of the driver chip, and the first filling element exposes the second side surface of the driver chip and another portion of the top surface of the driver chip.

2. The display device of claim 1, wherein the first filling element contacts a portion of a top surface of the substrate element.

3. The display device of claim 1, further comprising a second filling element, which is spaced apart from the first filling element in a first direction and is not overlapped with the driver chip.

4. The display device of claim 3, wherein, in a second direction crossing the first direction, a width of the first filling element is smaller than a width of the second filling element.

5. The display device of claim 4, wherein the first filling element are provided in plurality, and the first filling elements are spaced apart from each other along the first direction on the driver chip.

6. The display device of claim 5, wherein a distance between adjacent first filling elements along the first direction is greater than a distance between the first filling element closest to the second filling element and the second filling element.

7. The display device of claim 1, further comprising a sealing element disposed along an edge region of the encapsulation element to couple the encapsulation element and the substrate element to each other;
   wherein a side of the sealing element facing the driver chip contacts with the first filling element.

8. The display device of claim 7, wherein the sealing element overlaps the first filling element on a plane view.

9. The display device of claim 1, further comprising an optical element disposed between the encapsulation element and the window element.

10. The display device of claim 9, wherein a side of the optical element facing the driver chip is in non-contact with the first filling element.

11. The display device of claim 10, further comprising an adhesive element disposed between the optical element and the window element,
    wherein a side of the adhesive element facing the driver chip is in non-contact with the first filling element.

12. The display device of claim 1, further comprising a light blocking layer disposed along an edge of a rear surface of the window element, and
    wherein the first filling element contacts the light blocking layer and the substrate element.

13. The display device of claim 1, wherein the first filling element includes a thermosetting material or a photocuring material.

14. The display device of claim 1, wherein the circuit layer comprises a thin-film transistor including a semiconductor pattern, a control electrode spaced apart from the semiconductor pattern, and input and output electrodes which are respectively coupled to two portions of the semiconductor pattern, and
    the device layer comprises an organic light emitting diode including a first electrode coupled to the thin-film transistor, a second electrode disposed on the first electrode, and a luminescent layer disposed between the first electrode and the second electrode.

* * * * *